(12) United States Patent
Cha et al.

(10) Patent No.: US 6,172,931 B1
(45) Date of Patent: Jan. 9, 2001

(54) SEMICONDUCTOR MEMORY DEVICE WITH A MULTI-BANK STRUCTURE

(75) Inventors: Gi-Won Cha; Kyu-Nam Lim, both of Kyunggi-do (KR)

(73) Assignee: Samsung Electronics Co., Ltd., Kyungki-do (KR)

( * ) Notice: Under 35 U.S.C. 154(b), the term of this patent shall be extended for 0 days.

(21) Appl. No.: 09/436,089

(22) Filed: Nov. 8, 1999

(30) Foreign Application Priority Data

Nov. 13, 1998 (KR) ........................................................ 9-48711

(51) Int. Cl.[7] ........................................................ G11C 7/00
(52) U.S. Cl. ................................................ 365/226; 365/193
(58) Field of Search ............................... 365/226, 230.03, 365/193

(56) References Cited

U.S. PATENT DOCUMENTS

| | | | |
|---|---|---|---|
| 5,659,519 | * 8/1997 | Lee et al. | 365/226 |
| 5,774,399 | * 6/1998 | Kwon | 365/226 |
| 5,862,096 | * 1/1999 | Yasuda et al. | 365/229 |
| 6,038,178 | * 3/2000 | Oh | 365/226 |

\* cited by examiner

Primary Examiner—Son T. Dinh
(74) Attorney, Agent, or Firm—Skjerven Morrill MacPherson LLP; David T. Millers

(57) ABSTRACT

A semiconductor memory device with multi-bank structure, includes multiple voltage boosting circuits or internal power supply voltage generating circuits, each of which generates a high voltage to be provided to a bank. The respective voltage boosting circuits or internal power supply voltage generating circuits are sequentially selected under the control of a select signal generating circuit which generates select signals corresponding to the voltage boosting circuits by use of a row address strobe signal. According to the above-mentioned configuration, the number of the voltage boosting circuits is less than the number of banks in the memory device. Therefore, the area that the voltage boosting circuits or internal power supply voltage generating circuits occupy on a chip does not increase in proportion to the increase in the number of banks.

17 Claims, 5 Drawing Sheets

SEMICONDUCTOR MEMORY DEVICE WITH A MULTI-BANK STRUCTURE

FIELD OF THE INVENTION

The present invention relates to a semiconductor memory device, and more particularly to a voltage boosting circuit of a semiconductor memory device.

BACKGROUND OF THE INVENTION

In a semiconductor memory device such as a dynamic RAM (random access memory), the transmission a data signal can shift of an effective voltage potential of the data signal. In a dynamic RAM including CMOS transistors, a voltage drop about equal to the threshold voltage of the MOS transistor occurs when transmitting a signal through the MOS transistor. This inevitable voltage drop becomes an obstacle to the accurate reading or writing of data and potentially could cause the loss of data. To solve this problem, a voltage boosting circuit can raise a voltage level to compensate for a voltage drop. U.S. Pat. No. 5,610,549 entitled *"VOLTAGE BOOSTING CIRCUIT OF A SEMICONDUCTOR MEMORY CIRCUIT"*, and U.S. Pat. No. 5,521,546 entitled *"VOLTAGE BOOSTING CIRCUIT CONSTRUCTED ON AN INTEGRATED CIRCUIT SUBSTRATE, AS FOR A SEMICONDUCTOR MEMORY DEVICE"* describe known voltage boosting circuits and are hereby incorporated by reference in their entirety.

FIG. 1 is a block diagram of a known dynamic RAM device 10 that includes eight banks (or cell array banks). Although not shown in FIG. 1, each bank 12 includes circuits for selecting rows and columns (for example, a row decoder circuit and a column decoder circuit), a sense amplifier circuit, a column pass gate circuit, and a data input/output buffer circuit. Each bank 12 also has a respective voltage boosting circuit 14 having a structure such as those disclosed in U.S. Pat. No. 5,610,549 or 5,521,546 patent. Banks 12 connect to a common line L1. When banks 12 are selected (or activated), the corresponding voltage boosting circuits 14 supply the selected banks 12 with a high voltage Vpp (having a voltage level higher than a power supply voltage level). An active signal BANKi indicates the activation of the bank i.

Dynamic RAM devices having larger storage capacity tend to have more banks. In the dynamic RAM devices having a multi-bank structure, circuitry required for voltage boosting circuits 14, which are selected in accordance with activation information for the respective banks 12, increases the required chip area. As a result, chip efficiency (an occupied area by the banks of a chip area) is lowered because the number of voltage boosting circuits 14 corresponds to the number of banks 12.

SUMMARY OF THE INVENTION

According to an aspect of the present invention, a semiconductor memory device with multi-bank structure includes voltage boosting circuits (or internal power supply voltage generating circuits) and a select signal generating circuit that controls sequential selection of respective voltage boosting circuits (or internal power supply voltage generating circuits). The select signal generating circuit uses a row address strobe signal in generating select signals corresponding to the voltage boosting circuits. A voltage boosting circuit (or internal power supply voltage generating circuit) thus selected generates a high voltage (or an internal power supply voltage) to be provided to a bank which is selected in accordance with the row address strobe signal.

According to the above-mentioned configuration, the number of the voltage boosting circuits (or internal power supply voltage generating circuits) is less than the number of banks in the memory device. With larger storage capacity memory devices, the area that the voltage boosting circuits (or internal power supply voltage generating circuits) occupy on a chip is a smaller proportion of the total chip area.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF THE PREFERRED EMBODIMENT

Figure 1:
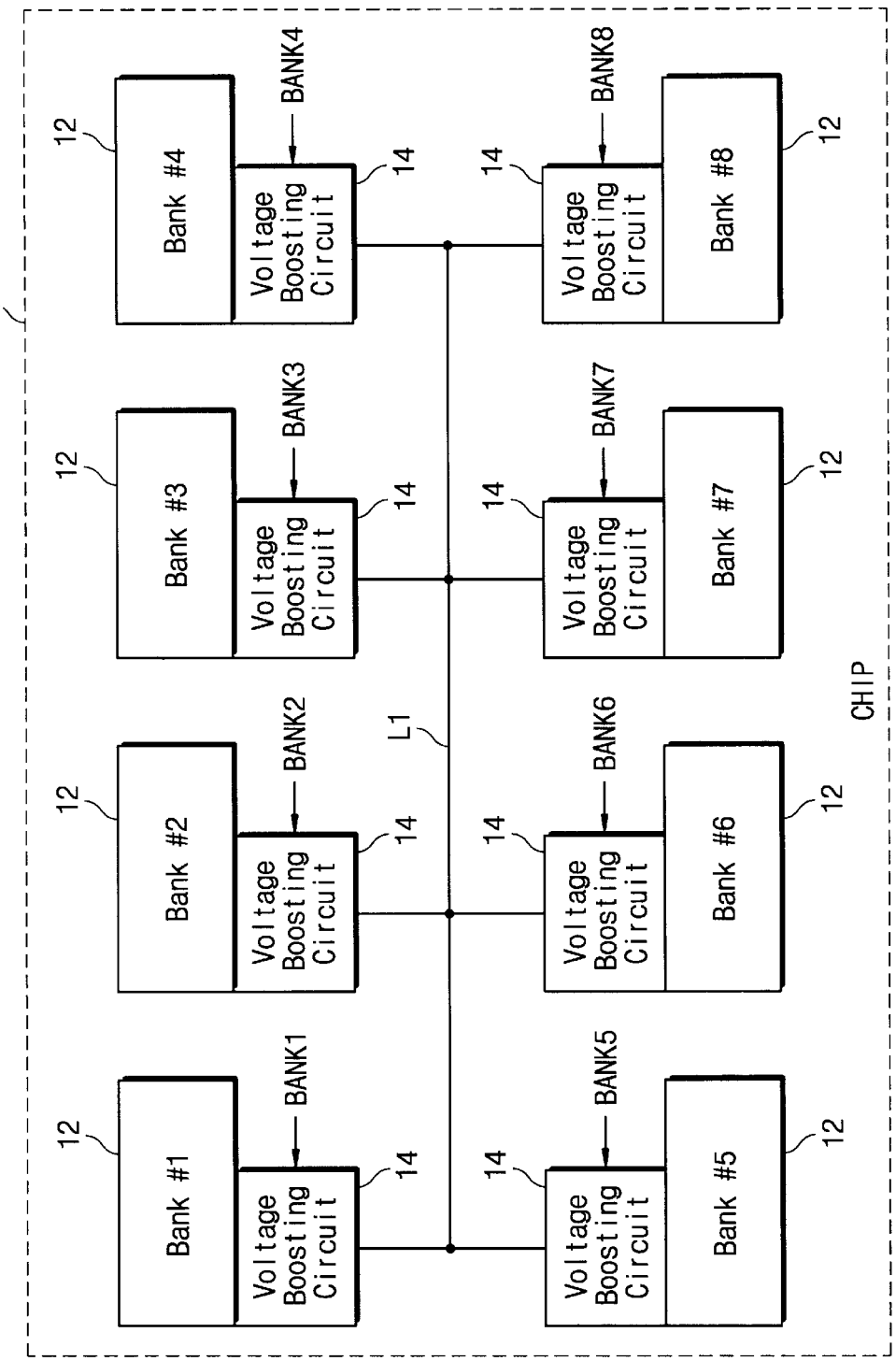
FIG. 1 is a block diagram of a prior art semiconductor memory device.
Figure 2:
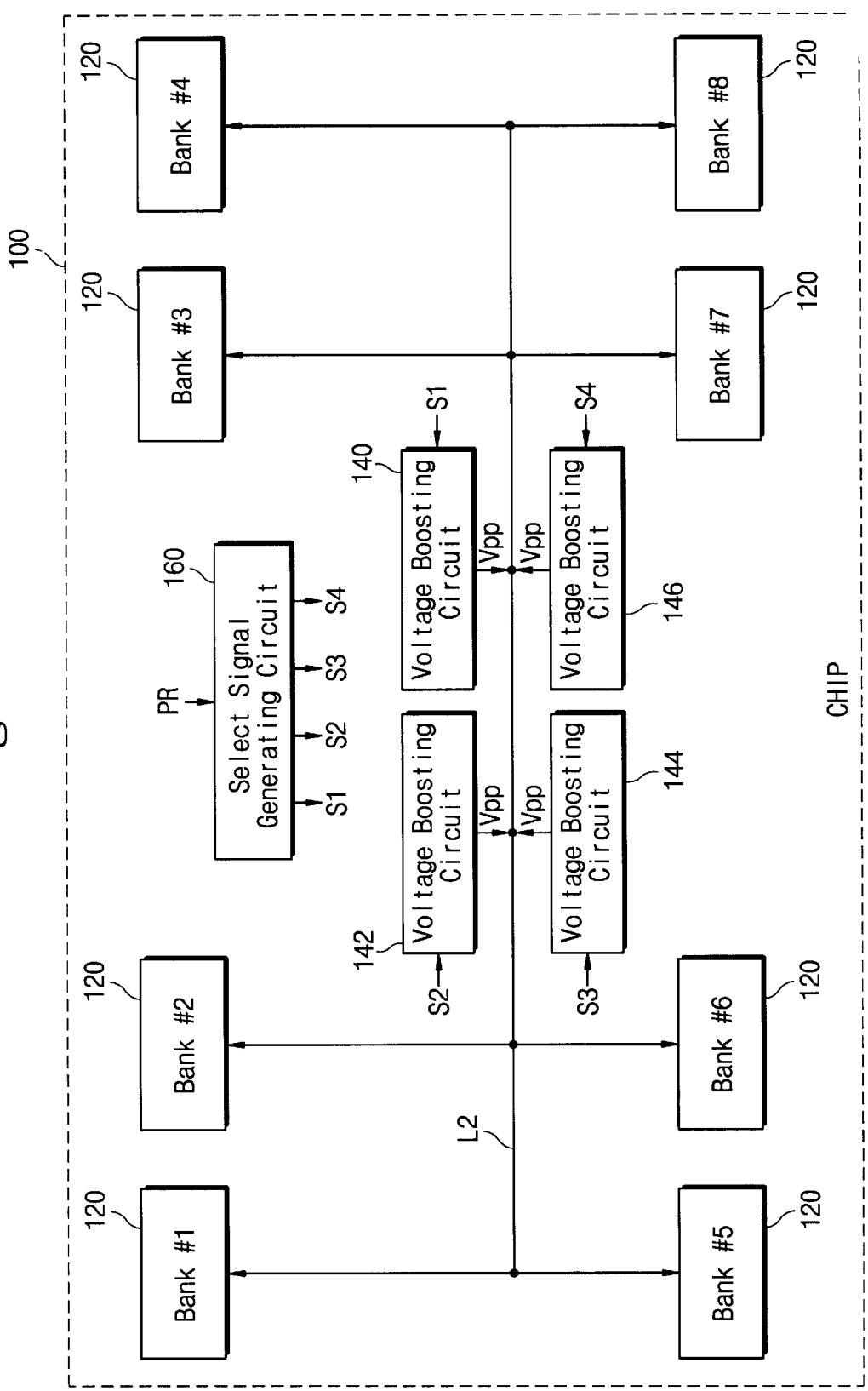
FIG. 2 is a block diagram of a semiconductor memory device according to an embodiment of the present invention.

FIG. 2 is a block diagram of a semiconductor memory device according to an embodiment of the present invention. For convenience, this description mostly describes an example where a memory cell array of the semiconductor memory device (semiconductor memory chip) 100 is divided into eight banks (cell array banks) 120. However, the principals of the invention are applicable to memory cell arrays divided into any number of banks, not just eight. Each bank 120 can be a convention DRAM memory bank that includes circuits for selecting rows and columns (for example, a row decoder circuit and a column decoder circuit), a sense amplifier circuit, a column pass gate circuit, a data input/output buffer circuit, and other associated circuitry. Although not shown in FIG. 2, the semiconductor memory device 100 is synchronized with an externally applied clock signal (for example, system clock) and a cycle (clock period or clock time) of the clock signal is about 10 ns (a clock frequency of 100 MHz). The following description uses these exemplary parameters in explaining the device's configuration of operation.

In FIG. 2, the semiconductor memory device 100 includes four voltage boosting circuits 140, 142, 144 and 146 which are commonly coupled to a voltage transfer line L2. In response to a corresponding one of select signals S1, S2, S3 and S4, each voltage boosting circuits 140 to 146 generates a high voltage Vpp (for example, a word line voltage having a voltage level higher than a power supply voltage level) and provides the high voltage Vpp to a selected bank 120 during a normal operation (for example, read, write, and refresh operations)., A select signal generating circuit 160 sequentially generates the select signals S1 to S4 in response to a signal PR, which is in synchronism with a row address strobe signal $\overline{RAS}$ and is an active high pulse signal. For example, when the signal PR is activated in a pulse form from a logic low level to a logic high level, the select signal generating circuit 160 activates one of the select signals S1 to S4 (for example, S1). This forces the corresponding voltage boosting circuit (140) to generate the high voltage Vpp, which is supplied through the voltage transfer line L2 to a selected bank. When the signal PR next transitions from a logic low level to a logic high level, the select signal generating circuit 160 activates the next select signal (for example, S2). In response, the next voltage boosting circuit (142) generates the high voltage Vpp, which is supplied through the voltage transfer line L2 to the selected bank.

The reason why the four voltage boosting circuits 140 to 146 are in the semiconductor memory device 100 is as follows. In a multi-bank dynamic RAM device, a time $t_{RRD}$ (the row to row delay time) required when the row address strobe signal $\overline{RAS}$ is continuously activated conventionally must be longer than the time corresponding to one cycle (clock period or clock time) of the externally applied clock signal. In an exemplary embodiment, the time $t_{RRD}$ is twice the clock period or about 20 ns, and the time required for a voltage boosting circuit to boost up to the high voltage Vpp is about 60 ns. In this embodiment, since the time of 60 ns required for generating the high voltage Vpp is three times the row-to-row delay time $t_{RRD}$, four voltage boosting circuits are sufficient for the memory device 100 regardless of the number of banks 120.

Figure 3:
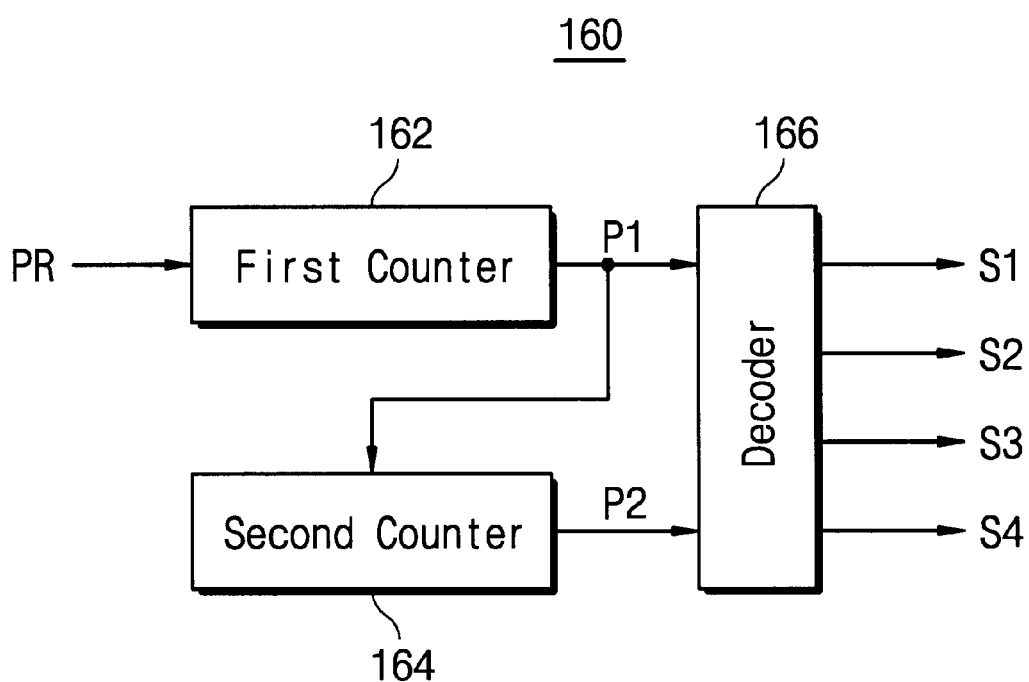
FIG. 3 shows an embodiment of a select signal generating circuit in the memory device of FIG. 2.

If the boosting capability of a voltage boosting circuit is improved (that is, the time required for boosting from a drop voltage level to a target voltage level is shortened), the required number of the voltage boosting circuits is fewer than four regardless of the number of banks. Assuming banks 120 and voltage boosting circuits of the size currently in use, the semiconductor memory device 100 having eight banks 120 and only four voltage boosting circuits requires about 1% less area than do conventional memory designs employing eight banks and eight voltage boosting circuits. FIG. 3 shows an embodiment of the select signal generating circuit 160 in FIG. 2. The select signal generating circuit 160 comprises first and second counters 162 and 164 and a decoder 166. The first counter 162 generates a first signal P1 in response to the signal PR which is synchronized with the row address strobe signal $\overline{RAS}$, and the second counter 164 generates a second signal P2 in response to the first signal P1. In particular, the first counter 162 toggles the first signal P1 between a logic low level (0) and a logic high level (1) when the signal PR transitions from a logic high level to a logic low level. The second counter 164 toggles the second signal P2 between a logic low level (0) and a logic high level (1) when the first signal P1 transitions from the logic high level to the logic low level. In this embodiment, the first and second counters 162 and 164 can be binary counters.

The decoder 166 decodes the first and second signals P1 and P2 to sequentially generate the select signals S1 to S4. For example, the decoder 166 activates the select signal S1 when the first and second signals P1 and P2 are '00', the select signal S2 when the first and second signals P1 and P2 are '01', the select signal S3 when the first and second signals P1 and P2 are '10', and the select signal S4 when the first and second signals P1 and P2 are '11'. As a result, the counters 162 and 164 and the decoder 166 sequentially and repeatedly generate the select signals S1 to S4.

Figure 4:
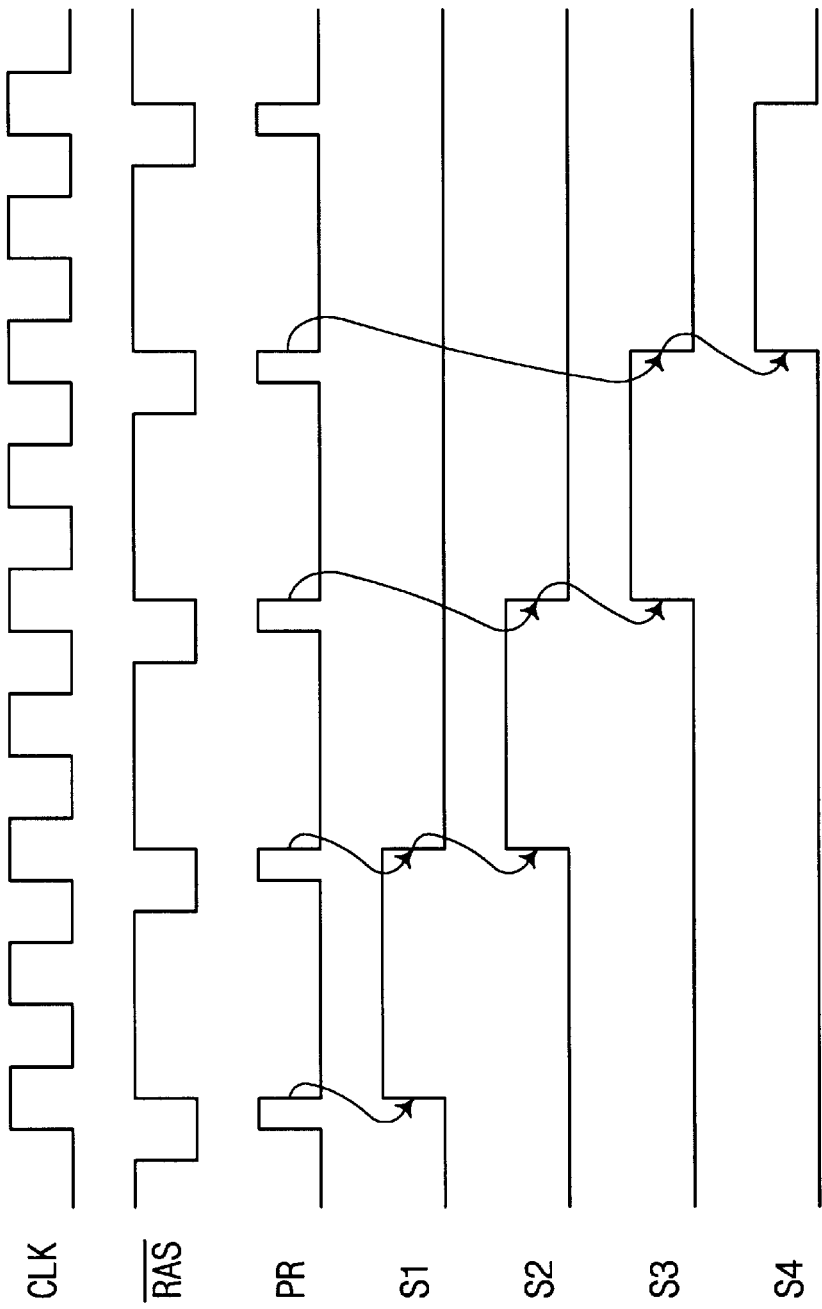
FIG. 4 is a timing diagram illustrating operation of a voltage boosting circuit according to an embodiment of the present invention.

FIG. 4 is a timing diagram illustrating operation of the voltage boosting circuits according to the above embodiment of the present invention. For FIG. 4, each of the first and second signals P1 and P2 from the first and second counters 162 and 164 initially has the value '1'.

One of the banks 120 in FIG. 2 may be selected depending on a row address externally provided when the row address strobe signal $\overline{RAS}$ synchronized with a clock signal CLK transitions from a logic high level to a logic low level. Then, the signal PR, which is in synchronism with the row address strobe signal $\overline{RAS}$, is inputted to the first counter 162 of the select signal generating circuit 160. The signal P1 from the first counter 162 transitions from the logic high level to the logic low level in synchronism with a falling edge of the signal PR, and the signal P2 from the second counter 164 transitions from the logic high level to the logic low level in synchronism with a falling edge of the first signal P1. The decoder 166 decodes the first and second signals P1 and P2 as each having value '0' and activates a select signal S1 as illustrated in FIG. 4. This enables the voltage boosting circuit 140, which generates the high voltage Vpp, and provides voltage Vpp to the selected bank through the voltage transfer line L2.

As illustrated in FIG. 4, as the row address strobe signal $\overline{RAS}$ transitions from a logic high level to a logic low level in synchronism with the clock signal CLK after two clock periods. At this time, another of the banks 120 in FIG. 2 may be selected depending on an externally applied row address. A pulse in signal PR marks the new memory access, and the first signal P1 is activated high in response to a high-to-low transition of the signal PR. At this time, the second signal P2, which is generated from the second counter 162 in synchronism with a falling edge of the first signal P1, remains at the previous state, that is, logic '0'. Therefore, the decoder 166 decodes the first signal P1 of value '1' and the second signal P2 of value '0', deactivates the select signal S1, and activates the select signal S2. In response to select signal S2, the voltage boosting circuit 142 generates the high voltage Vpp, which is then transferred to the selected bank through the voltage transfer line L2. In accordance with the above-mentioned manner, the voltage boosting circuits 140, 142, 144, and 146 sequentially operate so as to generate and provide the high voltage Vpp to the selected banks in time for the access operations performed.

Figure 5:
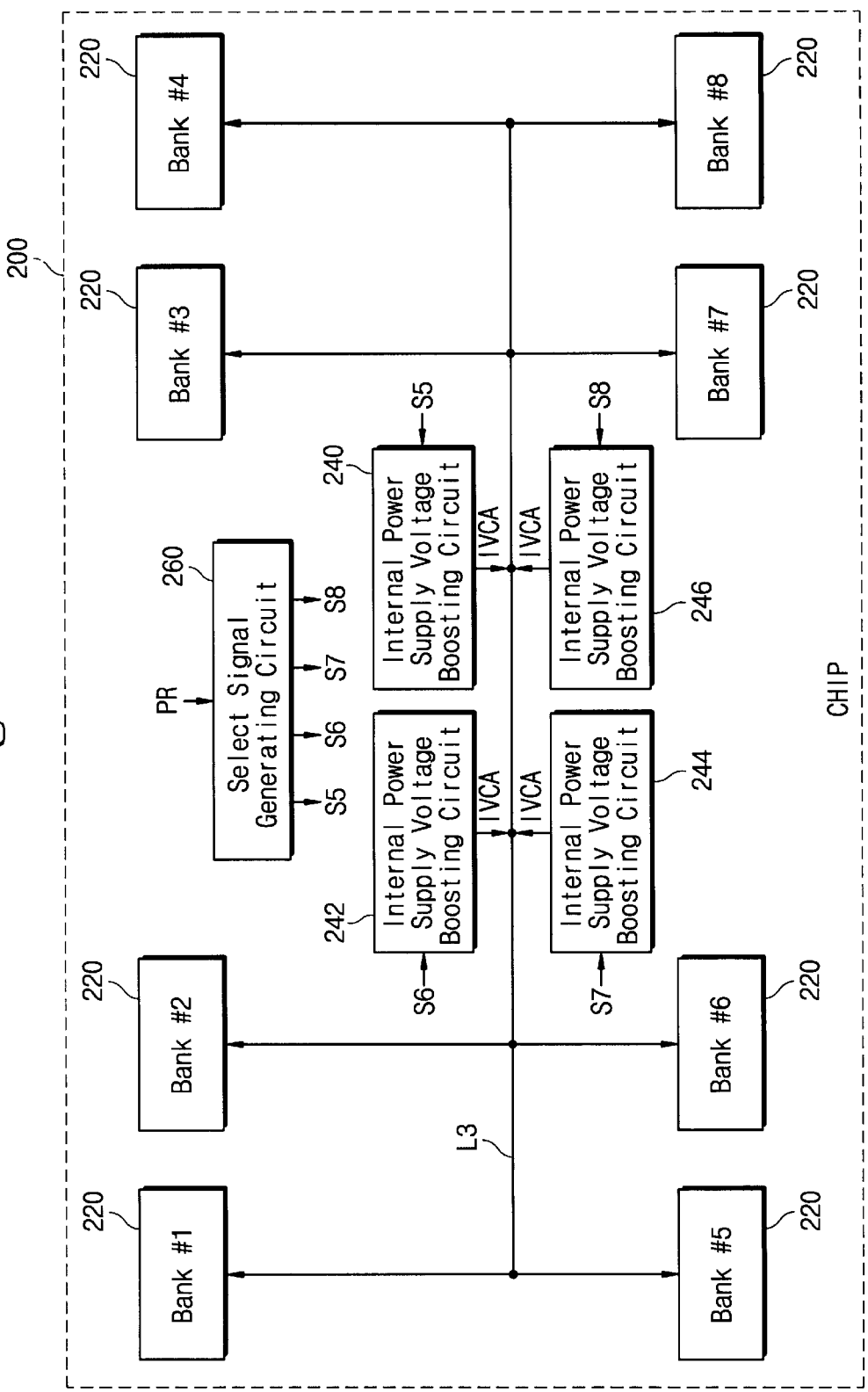
FIG. 5 is a block diagram of a semiconductor memory device according to another embodiment of the present invention.

FIG. 5 shows another semiconductor memory device 200 according to another embodiment of the present invention. For convenience, the following description assumes that a memory cell array of the semiconductor memory device 200 is divided into eight banks 220. The description further assumes that the semiconductor memory device 200 is synchronized with an externally applied clock signal (for example, a system clock) having a clock period of 10 ns (or equivalently, a clock frequency of 100 MHz). With these assumptions, the memory device 200 of FIG. 5 differs from the memory device 100 of FIG. 2 in that the voltage boosting circuits 140 to 146 in FIG. 2 are replaced with internal power supply voltage generating circuits 240 to 246. Each of the internal power supply voltage generating circuits 240 to 246 generates an internal power supply voltage IVCA. The function and operation of the other elements 220, 260, and L3 illustrated in FIG. 5 are identical to the elements 120, 160, and L2 illustrated in FIG. 2 and described above. Therefore, the further description of elements 220, 260, and L3 is omitted.

According to an aspect of the present invention, the semiconductor memory device with multi-bank structure includes voltage boosting circuits (or internal power supply voltage generating circuits) which are sequentially selected depending on the row address strobe signal and without using bank select information. Accordingly, the voltage boosting circuits (or internal power supply voltage generating circuits) are not in one-to-one correspondence with the banks, and the number of voltage boosting circuits (or internal power supply voltage generating circuits) can be less than the number of banks in the memory device. The smaller number of voltage boosting circuits (or internal power supply voltage generating circuits) leaves more integrated circuit area for a memory cell array (or banks) on a chip (that is, chip efficiency is improved). In other words, the area taken by the voltage boosting circuits (or internal power supply voltage generating circuits) can be reduced though the storage capacity of the memory device is increased.

All circuit configurations (the voltage boosting circuits and the internal power supply voltage generating circuits) according to the above embodiments can be implemented in the semiconductor memory device with a multi-bank structure.

The invention has been described using exemplary embodiments. However, the scope of the invention is not limited to the disclosed embodiments. To the contrary, it is intended to cover various modifications and similar arrangements. The scope of the claims, therefore, should be accorded the broadest interpretation so as to encompass all such modifications and similar arrangements.

What is claimed is:

1. A semiconductor memory device comprising:
   a plurality of banks each having a plurality of memory cells for storing information;
   a selection signal generating circuit for sequentially activating selection signals in response to a clock signal; and
   a plurality of voltage boosting circuits, wherein each of the voltage boosting circuits generates a higher voltage than a power supply voltage to be supplied to at least one selected bank in response to activation of a corresponding one of the selection signal,
   wherein the voltage boosting circuits are fewer than the banks.

2. The device according to claim 1, wherein the clock signal is synchronized with a row address strobe signal.

3. The device according to the claim 1, wherein the selection signal generating circuit comprises:
   a counter that counts in response to the clock signal and outputs a count signal; and
   a decoder that decodes the count signal and activates the selection signal corresponding to a value of the count signal.

4. The device according to the claim 1, wherein said device is synchronized with an externally applied clock signal.

5. The device according to the claim 4, wherein a number of the voltage boosting circuits in the device is determined according to a period of the externally applied clock signal and a boosting capacity of each voltage boosting circuit.

6. A DRAM device comprising:
   a plurality of banks each having a plurality of memory cells for storing information;
   a voltage transfer line connected to the banks in common, for supplying a higher voltage than a power supply voltage;
   a selection signal generating circuit for sequentially activating selection signals in response to a clock signal; and
   a plurality of voltage boosting circuits connected to the voltage transfer line in common, for sequentially generating the higher voltage in response to the corresponding selection signals,
   wherein the voltage boosting circuits are fewer than the banks.

7. The device according to the claim 6, wherein the selection signal generating circuit comprises:
   a counter that counts in response to the clock signal and outputs a count signal; and
   a decoder that decodes the count signal and asserts the selection signal corresponding to a value of the count signal.

8. The device according to the claim 6, wherein the device is synchronized with an externally applied clock signal.

9. The device according to the claim 8, wherein a number of the voltage boosting circuits is determined according to a period of the externally applied clock signal and a boosting capacity of each voltage boosting circuit.

10. A semiconductor memory device comprising:
    a plurality of banks each having a plurality of memory cells for storing information;
    a selection signal generating circuit responsive to a clock signal, for sequentially activating selection signals; and
    a plurality of internal power supply voltage generating circuits, each of which generates an internal power supply voltage as a power supply to be supplied into at least one selected bank in response to the corresponding selection signal,
    wherein the internal power supply voltage generating circuits are fewer than the banks.

11. The device according to claim 10, wherein the clock signal is synchronized with a row address strobe signal.

12. The device according to the claim 11, wherein the selection signal generating circuit comprises:
    a counter that counts in response to the clock signal and outputs a count signal; and
    a decoder that decodes the count signal and asserts the selection signal that corresponds to a value of the count signal.

13. The device according to the claim 10, wherein said internal power supply voltage is used only as a power supply voltage for an array of the memory cells.

14. The device according to the claim 10, wherein a number of the internal power supply voltage generating circuits is determined according to a period of an externally applied clock signal and a capacity of each internal power supply voltage generating circuit.

15. A semiconductor memory device comprising:
    a plurality of banks each having a plurality of memory cells for storing information;
    a voltage transfer line connected to the banks in common, for supplying at least one bank to be selected with an internal power supply voltage;
    a selection signal generating circuit responsive to a clock signal, for sequentially producing selection signals; and
    a plurality of internal power supply voltage generating circuits connected to the voltage transfer line in common, each of which generates the internal power supply voltage as a power supply to be supplied into at least one selected bank in response to the corresponding selection signal during an normal operation,
    wherein the clock signal is synchronized with a row address strobe signal; and
    wherein the internal power supply voltage generating circuits are fewer than the banks.

16. A semiconductor memory device comprising:
    a plurality of banks each having a plurality of memory cells for storing information;
    a first voltage transfer line connected to the banks in common, for supplying at least one bank to be selected with a higher voltage;

a second voltage transfer line connected to the banks in common, for supplying at least one bank to be selected with an internal power supply voltage;

a selection signal generating circuit for sequentially producing selection signals in response to a clock signal;

a plurality of voltage boosting circuits connected to the first voltage transfer line in common, for sequentially generating the higher voltage in response to the corresponding selection signals;

a plurality of internal power supply voltage generating circuits connected to the second voltage transfer line in common, each of which generates the internal power supply voltage as a power supply to be supplied into at least one selected bank in response to the corresponding selection signal during an normal operation, wherein the clock signal is synchronized with a row address strobe signal; and wherein the number of the voltage boosting circuits and the number of the internal power supply voltage generating circuits are less than that of the banks.

17. The device of claim 6, wherein the clock signal is synchronized with a row address strobe signal.

* * * * *